(12) United States Patent
Biswas et al.

(10) Patent No.: US 12,717,375 B2
(45) Date of Patent: Aug. 25, 2026

(54) RECONVERGENT CLOCK MESH FOR ON-CHIP COMPUTE CLUSTER

(71) Applicant: SiMa Technologies, Inc., San Jose, CA (US)

(72) Inventors: Sounil Biswas, San Jose, CA (US); Harivinay Kancharla, Karnataka (IN)

(73) Assignee: SiMa Technologies, Inc., San Jose, CA (US)

( * ) Notice: Subject to any disclaimer, the term of this patent is extended or adjusted under 35 U.S.C. 154(b) by 82 days.

(21) Appl. No.: 18/814,895

(22) Filed: Aug. 26, 2024

(65) Prior Publication Data

US 2026/0056571 A1 Feb. 26, 2026

(51) Int. Cl.
*G06F 30/396* (2020.01)
*G06F 1/10* (2006.01)

(52) U.S. Cl.
CPC .............. *G06F 1/10* (2013.01); *G06F 30/396* (2020.01)

(58) Field of Classification Search
None
See application file for complete search history.

(56) References Cited

U.S. PATENT DOCUMENTS 6,763,513 B1 * 7/2004 Chang ................... G06F 30/327 716/114
8,966,425 B1 * 2/2015 Eisenstadt ............. G06F 30/394 716/120
9,928,460 B1 3/2018 Nowatzyk et al.
11,321,607 B2 5/2022 Shah et al.
11,347,916 B1 * 5/2022 Desai ..................... G06N 3/063
11,354,570 B2 6/2022 Shah et al.
11,403,519 B2 8/2022 Shah et al.
11,631,001 B2 4/2023 Dhruvanarayan et al.
11,953,966 B1 * 4/2024 Wu ........................ G06F 1/3237
2018/0358970 A1 * 12/2018 Wang ............... H03K 19/17796
2019/0004878 A1 1/2019 Adler et al.
2019/0007047 A1 * 1/2019 Natu ................ H03K 19/17744
2019/0018815 A1 1/2019 Fleming et al.
2019/0076031 A1 3/2019 Valys et al.
2019/0155768 A1 5/2019 Wilkinson et al.
2019/0235568 A1 * 8/2019 Ou ............................ G06F 1/10
2019/0273662 A1 9/2019 Mwanje et al.
2019/0286973 A1 9/2019 Kovvuri et al.
(Continued)

OTHER PUBLICATIONS

Design and Analysis of "Tree + Local Meshes" Clock Architecture (Year: 2007).*
(Continued)

*Primary Examiner* — Kim Huynh
(74) *Attorney, Agent, or Firm* — Fenwick & West LLP

(57) ABSTRACT

A compute cluster includes a compute mesh of interconnected compute elements. A clock mesh includes reconvergent elements, and the reconvergent clock mesh distributes a clock signal to the compute elements. The clock mesh has a topology of nodes connected by branches. Repeaters are located on the branches between nodes. As a result, the reconvergent clock mesh is unidirectional. The repeaters limit the clock signal to forward propagation through the clock mesh and prevent backward propagation through the clock mesh. The clock mesh is reconvergent, in that the clock signal may branch out along different paths from one node and then these paths reconverge at a later node.

19 Claims, 9 Drawing Sheets

(56) References Cited

U.S. PATENT DOCUMENTS

| | | | | |
|---|---|---|---|---|
| 2019/0303346 | A1 | 10/2019 | Brewer | |
| 2019/0391796 | A1 | 12/2019 | Brady et al. | |
| 2020/0007342 | A1 | 1/2020 | Liem et al. | |
| 2020/0012536 | A1 | 1/2020 | Lacey et al. | |
| 2020/0012537 | A1 | 1/2020 | Lacey et al. | |
| 2020/0073830 | A1 | 3/2020 | Verrilli et al. | |
| 2020/0090383 | A1 | 3/2020 | Dwivedi | |
| 2020/0133914 | A1 | 4/2020 | Wilkinson et al. | |
| 2020/0150713 | A1 | 5/2020 | Knowles et al. | |
| 2021/0201526 | A1 | 7/2021 | Moloney et al. | |
| 2021/0312322 | A1 * | 10/2021 | Shah | G06F 8/41 |

OTHER PUBLICATIONS

Li et. al., Clock Mesh Synthesis Methodology Based on Combinatorial Optimization. Sep. 2023 (Year: 2023).*

Cheng et. al. , Cross-Mesh Clock Network Synthesis (Year: 2023).*

Andri et al., "YodaNN: An Architecture for Ultralow Power Binary-Weight CNN Acceleration", IEEE Transactions on Computer-Aided Design of Integrated Circuits and Systems, vol. 37, No. 1, Jan. 2018, pp. 48-60.

Ankit et al., "PUMA: A Programmable Ultra-efficient Memristor-based Accelerator for Machine Learning Inference", ASPLOS'19, Apr. 13-17, 2019, Providence, RI, USA, pp. 715-731.

Du et al., "ShiDianNao: Shifting Vision Processing Closer to the Sensor", ISCA'15, Jun. 13-17, 2015, Portland, OR, USA, pp. 92-104.

Everson et al., "A 104.8TOPS/W One-Shot Time-Based Neuromorphic Chip Employing Dynamic Threshold Error Correction in 65nm", IEEE Asian Solid-State Circuits Conference Nov. 5-7, 2018/Tainan, Taiwan, pp. 273-276.

Guha, "Deepframe: A Profile-driven Compiler for Spatial Hardware Accelerators", 2019 28th International Conference on Parallel Architectures and Compilation Techniques. (Year: 2019).

International Search Report and Written Opinion, Patent Cooperation Treaty Application No. PCT/US2021/025001, Jun. 10, 2021, 14 pages.

Jiao et al., "A 12nm Programmable Convolution-Efficient Neural-Processing-Unit Chip Achieving 825TOPS", ISSCC 2020, Session 7, Feb. 18, 2020, 5 pages.

Reuther et al., "Survey and Benchmarking of Machine Learning Accelerators", 2019 IEEE High Performance Extreme Computing Conference (HPEC) Sep. 24-26, 2019, pp. 1-9.

Shawahna et al., "FPGA-Based Accelerators of Deep Learning Networks for Learning and Classification: A Review", IEEE Access, vol. 7, 2019, pp. 7823-7858.

United States Office Action, U.S. Appl. No. 16/840,216, filed Sep. 3, 2021, 17 pages.

United States Office Action, U.S. Appl. No. 16/841,598, filed Sep. 30, 2021, 19 pages.

United States Office Action, U.S. Appl. No. 16/841,601, filed Oct. 15, 2021, 19 pages.

United States Office Action, U.S. Appl. No. 17/959,254, filed Jun. 30, 2025, 9 pages.

* cited by examiner

| | column1 | column2 | column3 | column4 |
|---|---|---|---|---|
| row1 | 0.213 | 0.252 | 0.288 | 0.326 |
| row2 | 0.253 | 0.286 | 0.319 | 0.355 |
| row3 | 0.291 | 0.319 | 0.349 | 0.383 |
| row4 | 0.332 | 0.356 | 0.383 | 0.414 |

600 Machine Learning Network
- Architecture (layers, nodes, interconnections, operators applied at nodes)
- Parameters (values of weights, biases, parameters for operators)

620 ML Compiler
- Instruction set
- Known execution duration of instructions
- Known MLA topology 650 Computer Program
- Instructions implement MLN on MLA
- Allocation of computations to PEs
- MLA instructions are statically scheduled.

670 Machine Learning Accelerator (MLA)
- Mesh of PEs + SEs
- PEs execute instructions
- Data transfer paths between PEs and SEs

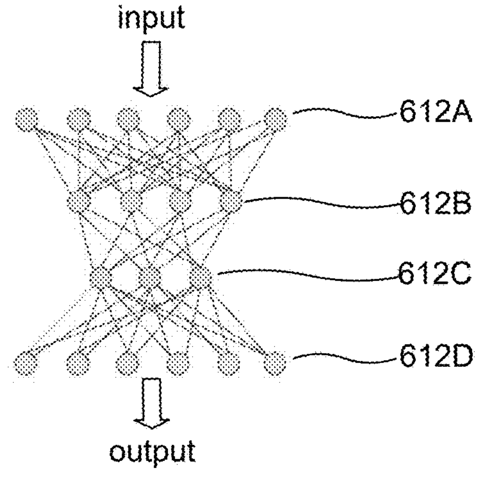

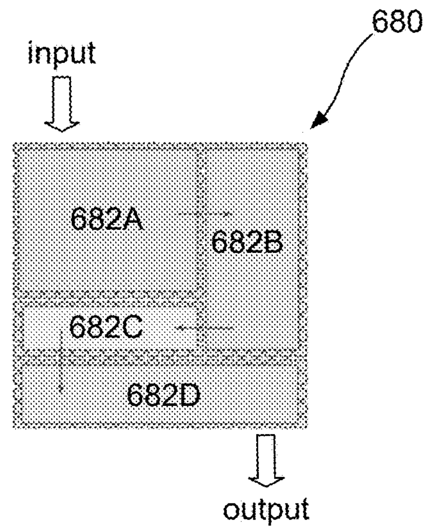

FIG. 6A

RECONVERGENT CLOCK MESH FOR ON-CHIP COMPUTE CLUSTER

BACKGROUND

1. Technical Field

This disclosure relates generally to the implementation of large compute clusters in semiconductor integrated circuits and more particularly to clock distribution for such compute clusters.

2. Description of Related Art

Modern compute-intensive semiconductor integrated circuits may include clusters of compute resources, such as processing elements. Often the entire cluster is designed to operate under a single synchronous clock domain. At the same time, these integrated circuits may often also target low-power, high-performance goals. PPA (power, performance, area) goals are important in the design of integrated circuits. As a result, the distribution of a common clock signal throughout the cluster may significantly help with meeting the timing requirements (e.g., specification of maximum clock skew between different compute resources), but without excessive power consumption and without compromising the performance.

One possible application for such compute clusters is machine learning. In machine learning, a model is developed to perform a certain task. The model, which will be referred to as a machine learning network, is trained and deployed in order to carry out that task. For example, a model may be developed to recognize the presence of objects within images captured by a set of cameras. Once the model is deployed, images captured by the cameras are input to the machine learning network, which then outputs whether or to what confidence level objects are present within the images.

There can be many advantages if the machine learning network can be embedded in edge devices, such as combined in a camera system. However, machine learning networks typically require the handling of a large volume of data and the execution of a large number of computations, and many edge devices, such as cameras, have significant resource limitations. Integrated circuits with compute clusters may be used to embed machine learning networks on edge devices, if they can be made sufficiently low-power and high-performance.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

FIG. 6A is a block diagram of a system with a machine learning accelerator (MLA) and corresponding compiler.

DETAILED DESCRIPTION OF THE PREFERRED EMBODIMENTS

Figure 1:
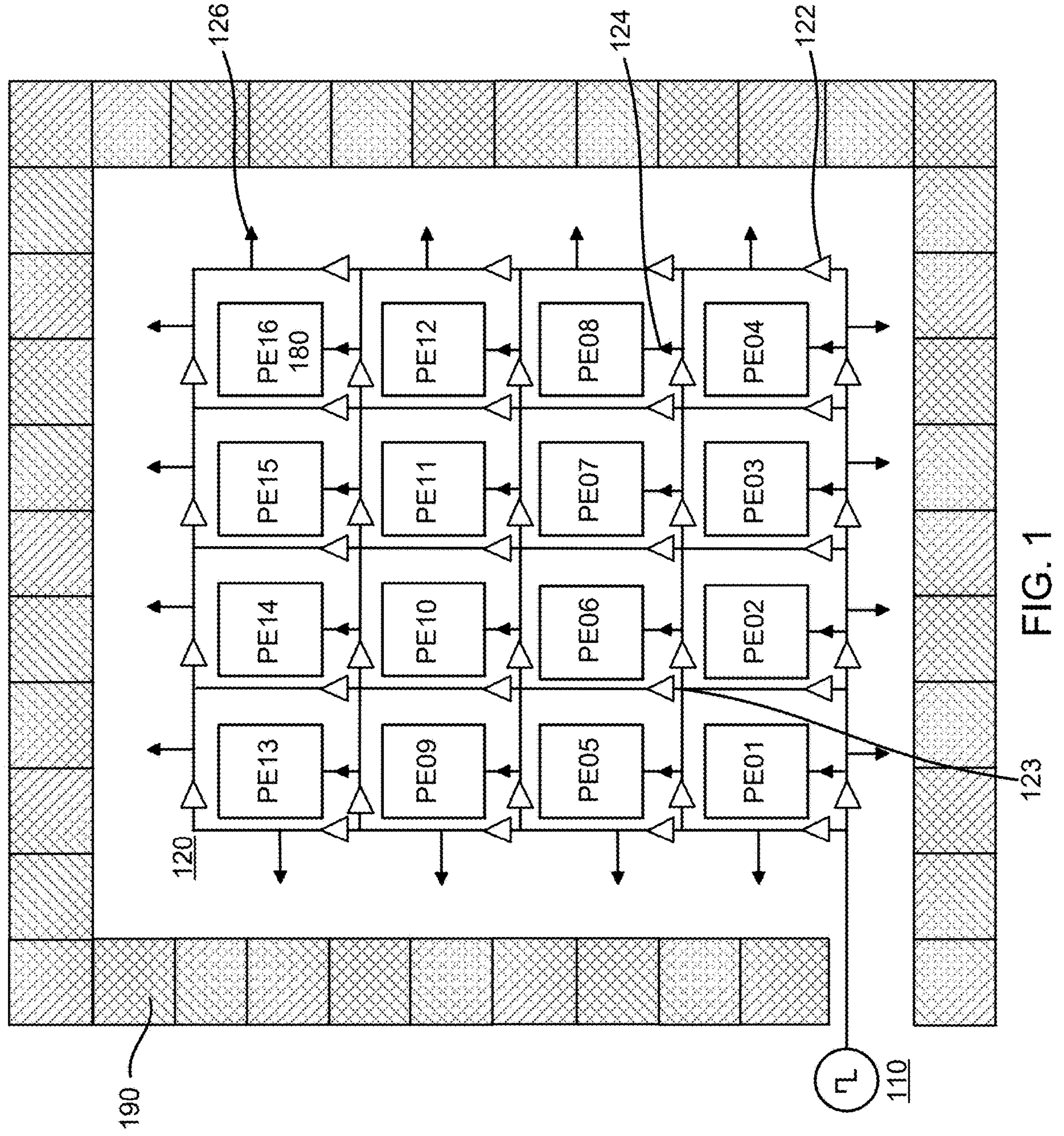
FIG. 1 is a diagram of a compute cluster with a forwarded reconvergent clock mesh.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Compute clusters implemented in an integrated circuit may include an array of small compute elements, sometimes referred to as computation blocks or processing elements. These building blocks or PEs may contain the primary computation units as well as the local or level-1 (L1) cache memory. An array of these PEs may be instantiated within the larger cluster, surrounded by periphery logic as well as second level or level-2 (L2) cache memory. Sometimes there is also a mid-level cache (LIC) memory either inside the PE or at the top level. The PEs may be synchronous, timed by a common clock signal. This configuration allows designers to build large compute clusters for various high-performance and/or low power applications. One such application is large-scale artificial-intelligence (AI) inferencing, such as the execution of machine learning networks.

However, implementing such a large, synchronous compute cluster in an integrated circuit is not an easy task. One challenge is the design of a high-performance, low-power, low-latency, low-skew global clock distribution network that can serve the entire synchronous cluster. As one can easily imagine, these design goals may conflict with each other. As a result, traditional clock distribution networks may not have acceptable performance.

This disclosure describes a forwarded reconvergent global clock-network implementation methodology. The reconvergent clock mesh distributes the clock signal to the compute elements. The clock mesh may be described as a topology of nodes connected by branches. Repeaters are located on the branches between nodes. The repeaters limit the flow of the clock signal to one direction through the clock mesh. The clock signal forward propagates through the clock mesh and does not backward propagate through the clock mesh. There are no feedback paths, only feedforward paths. As a result, the reconvergent clock mesh is unidirectional. The clock mesh is reconvergent, in that the clock signal may branch out along different paths from one node and then these paths reconverge at a later node. The contention between the repeaters driving the different paths also helps to reduce clock variations.

Furthermore, in some designs, the compute elements may interact only locally. For example, in an array of PEs, PEs may interact only with their nearest neighbors. As a result, global timing requirements may be relaxed. If a specification identifies the maximum allowable clock skew, the local clock skew between neighboring PEs may meet this specification, but the global clock skew between distant PEs that do not interact directly may be relaxed and may not be required to meet the specification.

FIG. 1 is a diagram of a compute cluster with a forwarded reconvergent clock mesh. The compute cluster includes a 4×4 array of compute elements 180: processing elements PE01-PE16. In this example, the PEs 180 are centrally positioned within the compute cluster and each PE is connected to its nearest neighbors. Memories 190 are placed around the periphery. Computations performed by the PEs 180, and data transfer between the PEs 180 and/or memories 190 are timed by a common clock signal 110, which is distributed by clock mesh 120.

The clock mesh 120 is defined by nodes connected by branches. In this example, the clock mesh 120 includes a 5×5 array of nodes connected by branches. Each branch in the array includes a repeater 122, shown as large triangles in the figure. Each branch contains the same number of repeaters, which is one repeater in this example. Tap repeaters 124, shown as smaller filled triangles in the figure, tap the clock signal from branches of the clock mesh and distribute the clock to each of the PEs 180. Here, there are sixteen tap repeaters 124 for the sixteen PEs 180. Each tap repeater 124 corresponds to one of the PEs 180 and distributes the clock signal from a different branch of the clock mesh to the corresponding PE. This design may be generalized to an M×N rectangular array of interconnected compute elements.

The clock signal 110 enters the clock mesh 120 from the bottom-left corner and propagates diagonally across the mesh to the top-right corner. Along the paths through the clock mesh, the clock signal diverges and subsequently reconverges. This reconvergent point acts as the source for the next set of diverging repeaters. In addition to the tap repeaters 124 for the PEs 180, dedicated tap repeaters 126 distribute the clock signal to memories 190 and registers local to the compute cluster. In this example, these tap repeaters 127 are located around the periphery of the PE array. Uniform tap repeater distribution facilitates the well-balanced local trees that can be built by incorporating multi-source clock-tree synthesis techniques. The arrival time to repeater outputs, which are shorted together, is well balanced to reduce the short circuit power. This, in turn, is achievable through the use of identical repeater, routing resources, and uniform repeat distances in the clock network implementation.

Consider PE06 and PE10. The clock reaches PE06 in four repeater stages and PE10 in five repeater stages (including tap repeaters). There are multiple paths for the clock signal 110 to reach PE06 and PE10. However, all paths to PE06 are four repeater stages and all paths to PE10 are five repeater stages. More generally, for any pair of nodes in the clock mesh, all paths between the nodes contain the same number of repeaters. Given the multiple paths from the incoming clock 110 to any PE, the clock arrival time for that PE is determined by the shortest delay path. The skew between PE06 and PE10 is one stage delay assuming that the same repeater, routing layers, and repeater distance are used at every stage. The shortest divergence between the two PEs happens at node 123, which is two stages away from PE10 and one stage away from PE06. This results in reduction in the overall clock reconvergence pessimism reduction (also known as CRPR) by eliminating the effect of on-chip variations in the common path.

Figure 2:
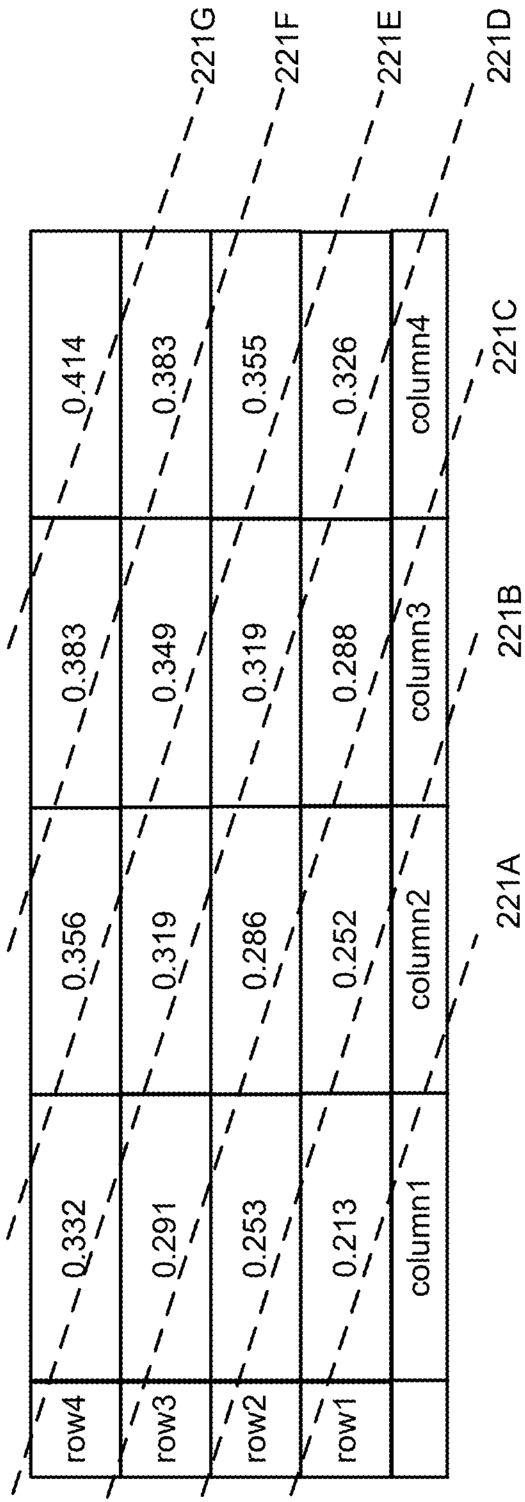
FIG. 2 is a table listing the clock arrival times (in ps) at processing elements (PEs) for a 4×4 array of PEs.

FIG. 2 lists the clock arrival times (in ps) at the PEs for the 4×4 array of PEs shown in FIG. 1. The clock signal has a frequency of 1 GHz. The diagonal dashed lines 221A-G show timing of the propagation of the clock signal across the diagonal of the array. The clock signal first arrives at the lower left row1 col1 PE as represented by diagonal 221A. It then progresses to the row2 col1 and row1 col2 PEs (diagonal 221B) and so forth to the upper right row4 col4 PE (diagonal 221G).

In some designs, the PEs interact only locally. As a result, timing requirements on the clock signal may be met within the applicable local region but may be relaxed for more distant PEs. For example, in FIGS. 1 and 2, assume that each PE interacts only with its nearest neighbors. PE06 interacts only with PEs05, 07, 02 and 10. The clock skew between PE06 and the other four PEs is the skew between diagonals 221C vs 221B in FIG. 2, and the skew between diagonals 221C vs 221D. If the maximum allowable clock skew is specified, that specification may be met by the local clock skew between these neighboring diagonals, even if a more global clock skew (e.g., between diagonals 221A vs 221G for the two opposite corners) does not meet the specification.

While designing the clock mesh, it is also important to consider the interface timing paths as well. This includes the timing requirements of the paths between the PEs and the channel logic/peripheral logic. Channel logic are sequential elements between the PEs. Peripheral logic include the memories 190 and sequential elements at the boundary of the cluster. Memory placement can be optimized according to the data flow. In the example design shown in FIG. 1, dedicated tap repeaters 126 are placed around the periphery of the clock mesh to drive the memories and channel registers. The local clock trees in these channels may be designed to match the total arrival times (including global and internal local clock trees) of registers in the compute elements in order to reduce the clock skews, which aids in interface timing closure. A similar approach can be followed for the memories and the external interface paths (i.e., paths to logic external to the cluster).

Figure 3:
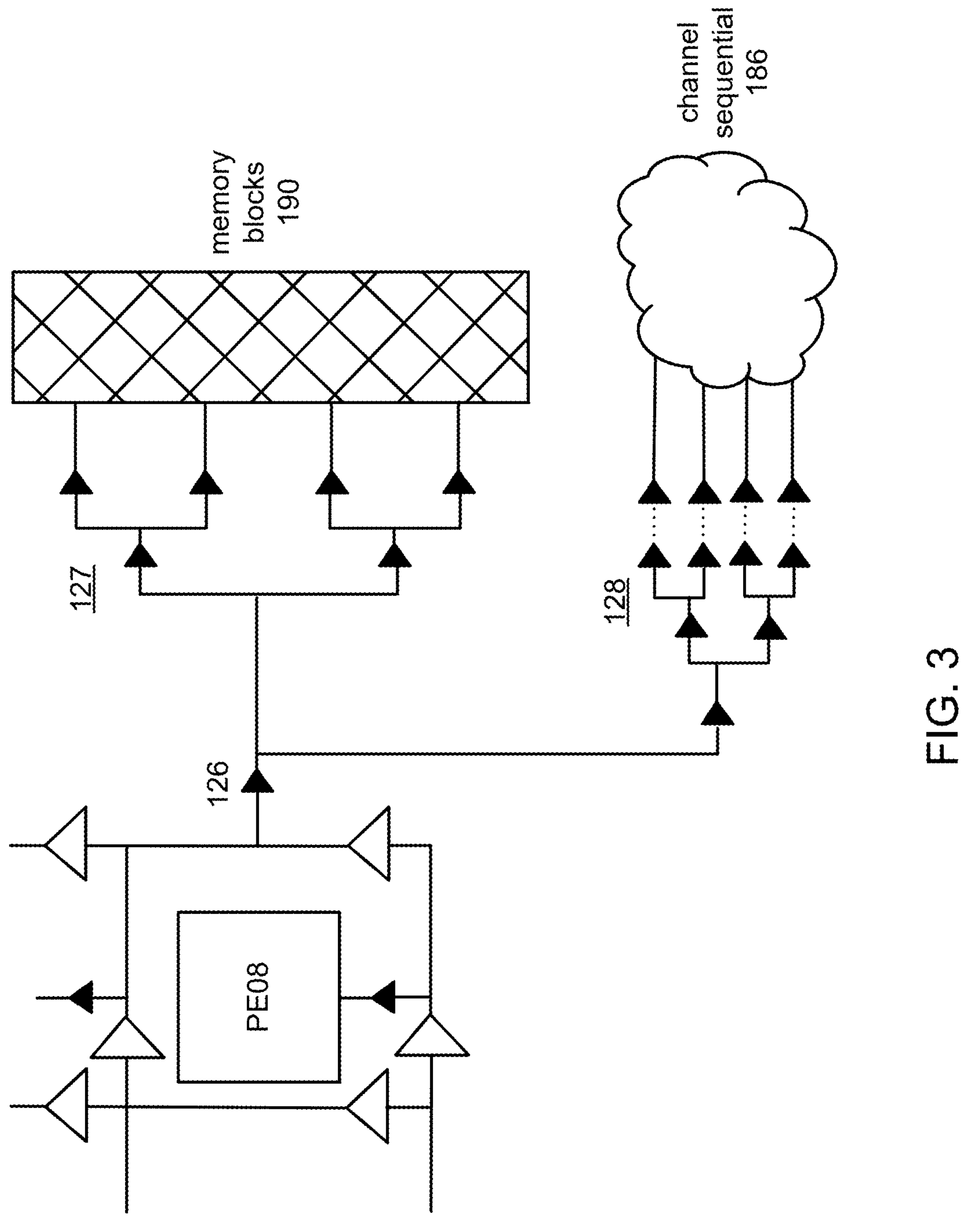
FIG. 3 is a diagram of clock trees connecting to the memories and registers in a compute cluster.

FIG. 3 is a diagram illustrating clock distribution to the memories and registers in the compute cluster. Local clock trees 127, 128 from tap repeater 126 distribute the clock signal to these memories 190 and channel registers 186. The early transmission of clock signals to the memories and PEs along with the construction of local trees in the subsystem channels based on target latencies derived from the total clock arrival-time to the PEs can both help reduce the overall timing-optimization effort as well as conserve valuable physical design resources (such as gates and metal layers).

Figure 4:
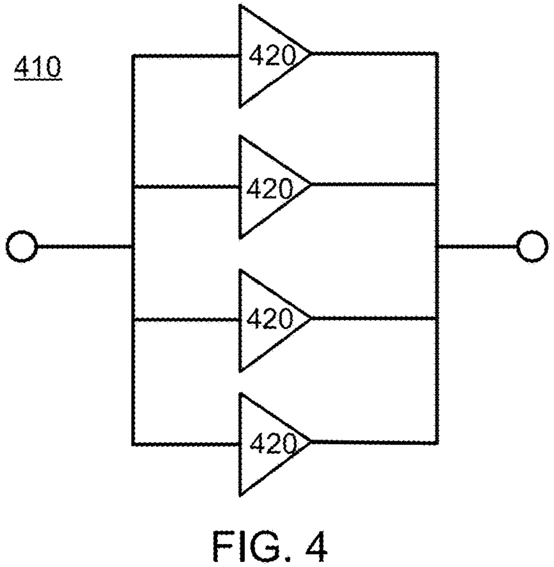
FIG. 4 is a diagram of a super repeater created by connecting standard-cell repeaters in parallel.

A combination of higher metal layers and high drive-strength repeaters may be used to implement the reconvergent clock mesh. If the repeaters in the standard cell libraries provided by foundries are not sufficient for driving the necessary long distances (which may be on the order of a few millimeters), custom super repeaters may be designed by shorting multiple standard-cell repeaters. FIG. 4 is a diagram of a super repeater 410 created by connecting multiple standard-cell repeaters 420 in parallel. The number of standard-cell repeaters required to create a super repeater depends on the design requirements, which can be derived by conducting some experiments on the achievable repeater distances versus drive strength as well as the instantaneous current draw.

Note that static timing analysis for mesh based architectures may not be effectively performed using the EDA tools currently available in the market. As an alternative, SPICE simulations may be conducted to generate the necessary clock-network annotations (cell and net delays, pin transitions, etc.), which are then fed into the static timing analysis flow for timing analysis of the overall design.

The forwarded reconvergent clock mesh described in this disclosure may result in the following advantages.

Average latency: If global skew balancing is not required across the entire compute cluster, the clock arrival times at each compute element may vary, specifically increasing from the compute element that is nearest to the clock entry point to the compute element that is farthest away. This is unlike traditional clock tree synthesis, where the clock arrival times are well-balanced across all the compute elements, which means that the average latency becomes equal to the longest latency. Consequently, as compared to traditional clock tree architectures, the average clock latency in the forwarded, reconvergent clock network may be reduced.

Local skew: The clock is well balanced between local compute elements. Moreover, the uniform distribution of tap repeaters that act as sources for the multi-source clock tree synthesis, enables the construction of well-balanced local clock trees with fewer repeater stages. This arrangement, in turn, reduces the effects of on-chip variation and ultimately the overall clock skew, including global and local skews, thus resulting in the reduction in efforts required towards both internal and interface timing closure in a design.

Power-supply induced jitter (PSIJ): The forward nature of the clock network also reduces the number of clock-tree repeater stages, which directly contributes to the reduction in the overall clock jitter. Also, the uniform tap-repeater distribution cuts down the number of repeater stages in the local trees, which further helps with decreasing the clock jitter.

Instantaneous current (di/dt): The clock signals by design arrive at each compute element over a larger distribution within the clock period due to global skew. The distribution of arrival times preferably is less than one period of the clock cycle. By staggering the clock arrival times among the compute elements, simultaneous switching activities are reduced across the compute elements. This, in turn, results in the reduction in any instantaneous current spike, and contributes to reduction in the total peak-power of the design.

Figure 5:
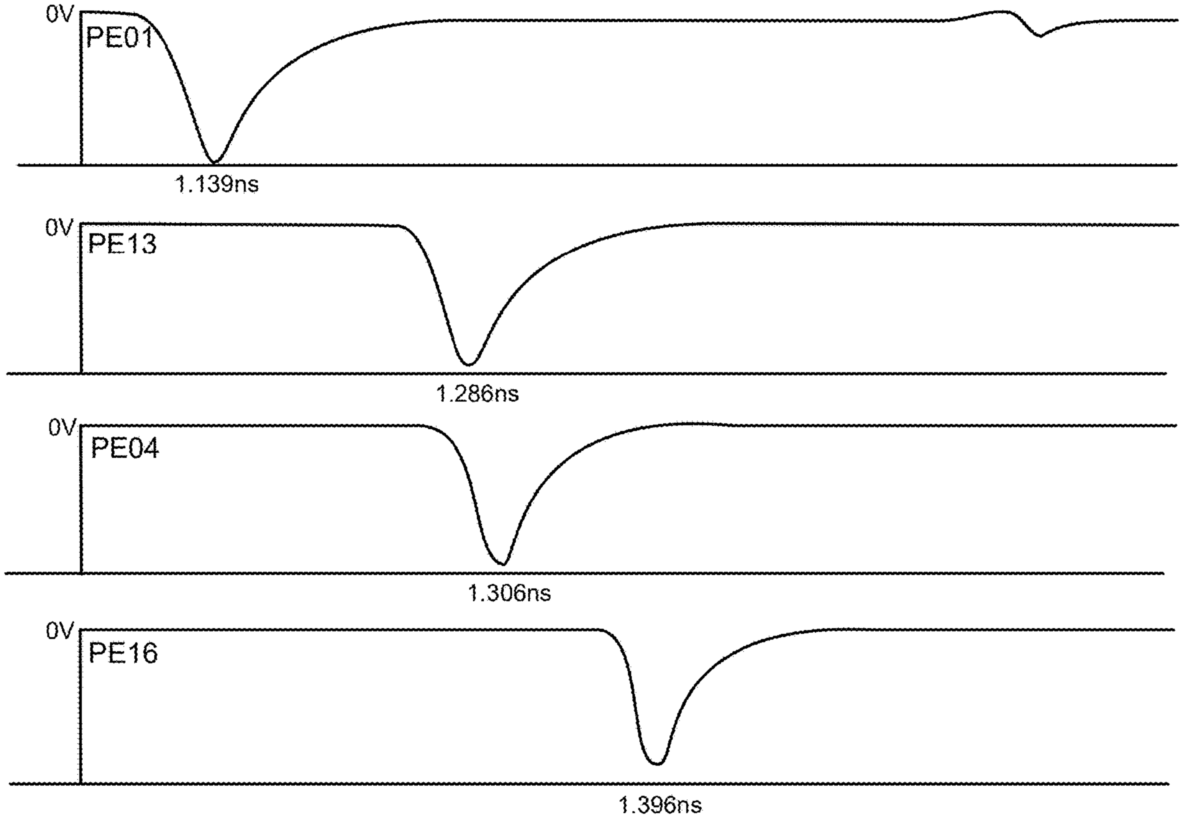
FIG. 5 are time plots of voltage for PEs at the four corners of a compute cluster.

FIG. 5 are plots of voltage over time for PEs at the four corners of a compute cluster. FIG. 5 shows the spread of switching currents at the PEs placed at the four corners of the compute cluster of FIG. 1. Note that, since the voltage droop at each compute element is staggered, a 0.65 mV droop at each compute element would only lead to at most an overall droop of about 2.5 mV (the four PEs along diagonal 221D multiplied by 0.65 mV droop each). In contrast, a traditional clock tree would have led to an overall droop of over 10 mV (all sixteen PEs multiplied by 0.65 mV droop each). This would be magnified many times over as the size of the compute cluster grows. For example, in a 10×10 cluster, the difference in the voltage droop would be about 6.5 mV versus 65 mV.

Design power draw: In typical high-speed designs, the clock networks consume 10-20% of total chip power. The current approach is a forwarded clock network, in which the clock travels in one direction, specifically from the clock source to the destination without branching backwards. This helps in reducing the overall load on the clock network as compared to a traditional clock distribution where the clock may have to move bi-directionally. This topology leads to a lower power consumption.

On-chip variation (OCV): Having more common stages in the clock paths between launch and capture flops often reduces the impact of OCV. Depending on the technology node, timing derates associated with OCV may be applied to the clock network from the point of clock divergence (that is, from the point where the clock path for the launch and capture flops are no longer common). The current approach maximizes the clock reconvergence which, in turn, also minimizes the number of repeater stages after the point of divergence in the clock distribution. This also helps with limiting the effects of OCV.

One application for chip-based compute clusters is in integrated circuits used for machine learning. Machine learning networks (MLNs) are commonly implemented in compute facilities with access to significant resources, such as in the cloud or on server clusters. However, the sources of input to machine learning networks may be located remotely from these large compute facilities. For example, cameras and other types of sensors may be edge devices. Example applications for edge devices include automotive and other forms of transportation including autonomous transportation, agricultural, industrial, robotics, drones, surveillance and security, smart environments including smart cities, medical and personalized health. Example tasks include computer vision, image analysis, image understanding, speech recognition, audio analysis, audio understanding, natural language processing, classification and pattern recognition tasks. For edge devices, it may be desirable to perform certain tasks in real-time. In addition to memory and other programmable processors, an edge device may also include sensors, such as cameras including both still image and video cameras, microphones, temperature sensors, pressure sensors and other types of sensors. The sensors may capture samples that are used as inputs to a computing pipeline within the edge device. Thus, it would be beneficial if MLNs could be implemented in edge devices.

A machine learning accelerator (MLA) with a compute cluster as described herein may be built into an edge device. The MLA executes a machine learning network. As described in more detail below, one method of optimizing execution of an MLN is to use a compiler that, prior to run-time, generates a computer program with statically scheduled blocks of instructions for executing the MLN. For example, the compiler may determine, for each block, which instructions are executed by which compute elements in the MLA at what time. Static scheduling enables the compute elements in the MLA to execute the instructions with no run-time conditions, branching or dependencies. This may result in lower power consumption, simpler MLA design, and lower cost.

Figure 6B:
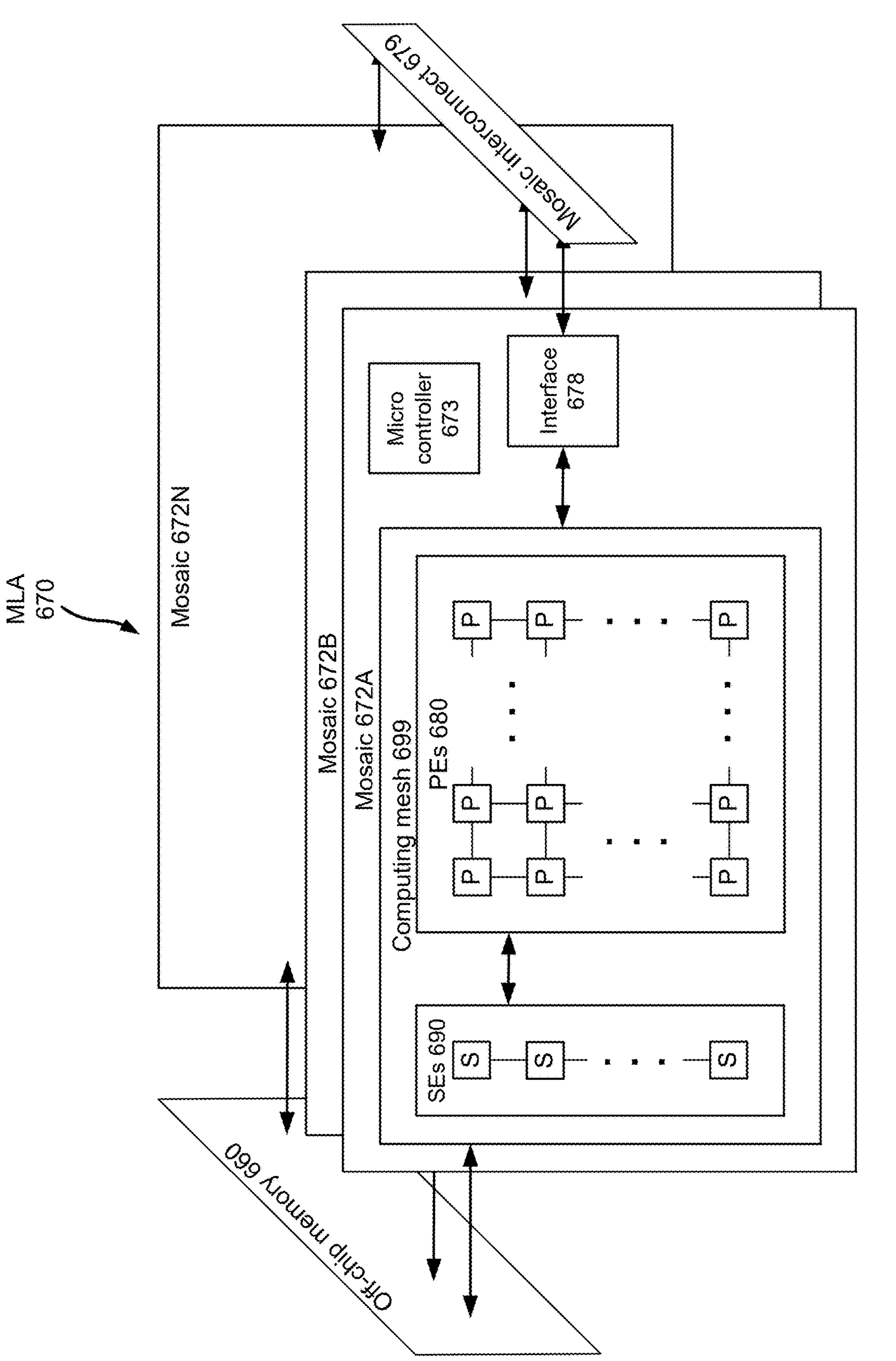
FIG. 6B is a block diagram of a hardware system including an MLA.
Figure 6C:
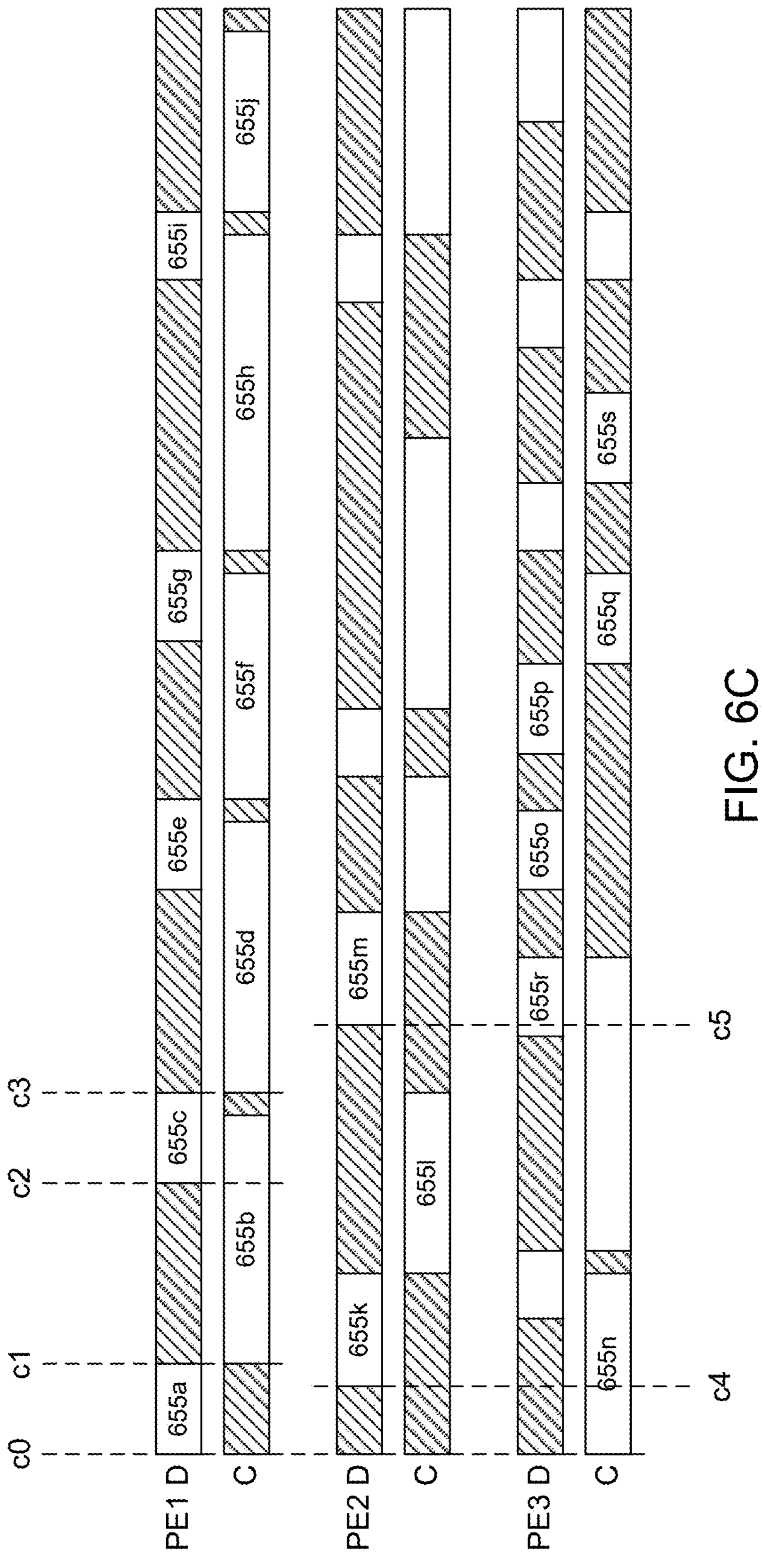
FIG. 6C illustrates execution of a statically scheduled program produced by a compiler.

FIGS. 6A-6C are more detailed descriptions of an example system that executes a statically scheduled program, as may use a compute cluster as described above. In one example, the compute cluster is a 10×10 array of PEs. The reconvergent clock mesh supports a clock signal with a frequency of at least 1 GHz, a supply voltage for the PEs that is not more than 750 mV, and a clock skew between adjacent PEs that is not more than 50 ps or not more than 5% of the clock cycle.

FIG. 6A is a block diagram of a system with an MLA and corresponding compiler. The MLA may be part of an edge device. The compiler 620 receives a description of a machine learning network 600 and generates a computer program 650 that implements the machine learning network using MLA 670. The computer program 650 includes instructions that are executed by processing elements (PEs) and/or storage elements (on-chip memory) in the MLA according to a schedule determined by the compiler. Certain instructions may be statically scheduled with respect to each other, because the compiler can determine which instructions are executed by which compute elements at what times. For statically scheduled instructions, there are no conditions, branching or data dependencies that can be resolved only at run-time, and which would affect the timing and order of the execution of the instructions.

Note that the static schedule determined by the compiler may or may not be included as part of the instructions and computer program. In some embodiments, the computer program may expressly include the schedule, specifying that instruction A is executed at cycle X, instruction B is executed at cycle X+4, instruction C is executed at cycle X+12, etc. In alternate embodiments, the computer program may specify only that instruction A is executed, followed by instruction B, and then instruction C, but without any scheduling information. Even though the static schedule is not expressly specified, these instructions will still execute according to the static schedule determined by the compiler because the compiler knows how long it takes to execute each instruction. As a result of the static scheduling, the MLA and instruction set for the MLA may be simplified, with the complexity offloaded to the compiler. A simpler MLA can result in lower cost, lower power consumption and higher performance, all of which are desirable for implementation in edge devices.

In more detail, the MLN 600 may be described by an architecture and parameters. A depiction of an MLN is shown to the right of box 600 in FIG. 6A. Most MLNs include multiple layers 612, each with one or more nodes which are represented by circles in FIG. 6A. The lines between nodes in FIG. 6A represent interconnections between the nodes and layers. Each node calculates a weighted sum of the values received from its connected nodes, possibly also applying a bias. Examples are matrix multiplication and convolution. Each node may also apply certain functionality or operators, such as nonlinear functions (e.g., tanh function), softmax operator, etc. A typical node may compute an output:

$$y=F(\Sigma w_i x_i+b) \quad (1)$$

where $x_i$ are the inputs received from other nodes i, $w_i$ are weights, b is a bias and F( ) is a nonlinear operator. The MLN architecture includes the number of nodes and layers and their interconnectivity, and the operators applied at nodes. The operators may be described in a parameterized form. The MLN parameters include the weights, biases, and parameters for the operators.

MLNs may vary in size, depending on the desired task. Small MLNs may have 8-10 or fewer layers, medium size MLNs may have 30-50 layers, and large MLNs may have 200 or more layers. Examples of inputs include text, images and video. Some of the layers may be fully interconnected where every node in one layer provides input to every node in the next layer. Others may be more locally interconnected, for example to implement convolutions. Each weighted interconnect represents a scalar multiplication. The total number of scalar multiplications required to implement an MLN may be on the order of millions, billions, tens of billions or even more. These may be carried out by matrix multiplications.

The MLA 670 includes many PEs and an on-chip memory system with storage elements (not shown in FIG. 6A) implemented on a semiconductor die. The PEs are organized into one or more meshes of interconnected PEs. A depiction of a PE mesh is shown to the right of box 670 in FIG. 6A. In this example, the PEs 680 are organized in a regular pattern and the interconnections within each mesh provide data transfer paths between PEs in the mesh. The PEs execute computations according to instructions received by the PEs and using data stored in the on-chip memory system. These instructions may be for computations and/or for data transfer. Computations include multiply (including matrix multiply), add, and operators (e.g., nonlinear functions, lookup table, min/max, pooling). These are computations that implement the MLN. In the example of FIG. 6A, the computations performed by layers 612A-D are allocated to groups 682A-D of PEs as indicated. The allocation is not required to be 1:1. For example, multiple layers could be allocated to a single PE or vice versa. Not every computation required to implement an MLN need be executed by a PE; some computation may be executed outside the MLA (e.g., floating point operations, if the PEs only do integer arithmetic). PEs typically will at least perform matrix multiplication.

The compiler 620 receives a description of the MLN 600 and generates a computer program 650 that implements the MLN using the MLA 670. The computer program 650 receives an input sample for the MLN and executes the operations of the MLN to produce the output for the MLN. The computer program 650 includes instructions to be executed by the PEs for implementing computations in the MLN and may also include instructions to be executed by other elements, such as the storage elements of the on-chip memory or a controller outside the PEs.

The program of statically scheduled instructions may include a series of computations required to implement a portion of the MLN, where the time required for each computation and associated data transfers is known. As a result, the compiler may statically schedule these instructions. The resulting computer program produced by the compiler then implements an allocation of compute instructions to PEs and a schedule for executing the instructions as determined by the compiler, although these may not be expressly contained with the computer program.

Non-deterministic instructions (i.e., instructions that are not statically scheduled) may also be used. For example, non-deterministic instructions may include data fetch and instruction fetch from off-chip memory where the time required to execute the operation varies too much to allow reliable synchronization with other operations. Other examples include computations that occur off-chip, and conditions, branching and other programmatic constructs that depend on values not known until run-time.

FIG. 6B is a block diagram of a hardware system including an MLA 670. The MLA 670 includes all the components shown in FIG. 6B, except the off-chip memory 660. The MLA components are implemented on a single die as part of a single chip. The MLA 670 includes one or more mosaics 672A-N. In this example, all of the mosaics are the same. Each mosaic 672 includes a compute mesh 699 that includes processing elements (PEs) 680 and storage elements (SEs) 690. Each mosaic 672 also includes a controller 673. In FIG. 6A, the overall memory system is a multi-level memory system, which includes a level 1 (L1) memory distributed within the PEs, a level 2 (L2) memory of SEs 690 which is shared by the PEs, and the off-chip memory 660. If there are multiple mosaics 672, the MLA 670 may include a dedicated interconnect 679 for connecting the different mosaics. Each mosaic also includes an interface 678 to the interconnect 679. In FIG. 6B, The SEs 690 handle data transfer to and from the off-chip memory 660. The PEs 680 receive instructions from the off-chip memory 660. For convenience, the interface to off-chip memory 660 is not shown in FIG. 6B.

FIG. 6C illustrates execution of a statically scheduled program produced by a compiler. This example shows only instructions executed by PEs but the statically scheduled program typically also includes instructions executed by SEs. Execution of the static schedule begins at some time when all of the PEs are synchronized, which for convenience is marked as cycle c0 in FIG. 6C. An external controller may synchronize the PEs and start execution of the statically scheduled program when all PEs are ready.

The example instructions shown in FIG. 6C are executed by three PEs, as denoted by PE1, PE2 and PE3. Each PE has two pipelines: a "D" pipeline for executing data transfer instructions and a "C" pipeline for executing compute instructions. The row labeled PE1 D shows instructions executed by the PE1 D (data transfer) pipeline, and the row labeled PE1 C shows instructions executed by the PE1 C (compute) pipeline. For this example, assume that all the data transfer instructions are instructions that load new data into that PE for consumption by the compute pipeline. The white regions of each row denote the execution of instructions and the hashed regions indicate that the pipeline is idling or executing a NO-OP (no operation).

For PE1, instruction 655*a* transfers data into PE1 from either another PE or from ones of the SEs, and instruction 655*b* then performs a computation that consumes that data. Instruction 655*b* is dependent on instruction 655*a*. Here, the PE1 C pipeline is not required to continuously poll the PE1 D pipeline at run-time for when the data is available, and run-time message passing between the pipelines is not required to indicate that the data is available. Rather, because the duration (i.e., time required to execute) of instruction 655*a* is known, the compiler knows when the data will be available (for convenience, marked as cycle c1 in the figure) and can construct a static schedule in which instruction 655*b* starts execution then. The duration of instruction 655*b* is also known, so the compiler knows that compute instruction 655*d* may start after instruction 655*b*. In this case, the compiler determines a static schedule in which instruction 655*d* starts at cycle c3. Compute instruction 655*d* depends on data brought into the PE by instruction 655*c*. The duration of instruction 655*c* is known, so the compiler knows that in the static schedule, instruction 655*c* must start at cycle c2 or earlier. This pattern is repeated for pairs of data transfer instructions and compute instructions 655*e-f*, 655*g-h*, 655*i-j*.

For PE2, compute instruction 655*l* depends on data from data transfer instruction 655*k*. However, instruction 655*k* does not start immediately at cycle c0. Rather, it has a delayed start at cycle c4. This may be because the data transfer path required by instruction 655*k* is occupied by some other data transfer instruction and is not available until cycle c4. The start time of instruction 655*k* in the static schedule is not determined by run-time arbitration or contention mechanisms for the shared data transfer path. Rather, the compiler knows that the data transfer path is occupied since the compiler knows the start times and durations of all the data transfer instructions, so the compiler simply creates a static schedule in which instruction 655*k* does not start until cycle c4 when the compiler knows the data transfer path will be available. Similarly, data transfer instruction 655*m* has a delayed start time. Perhaps the PE2 D pipeline is being used to transfer out the results of computation 6551 and does not become available until cycle c5.

For PE3, computation 655*n* starts immediately at cycle c0. Perhaps the required data was loaded into PE3 during some prior phase. Data transfer instructions 6550 and 655*p* load data for compute instruction 655*q*. They are separated in time, perhaps because different pieces of data were not available or the data transfer paths were not available until those times. As a final example, data transfer instruction 655*r* loads data for compute instruction 655*s*. In the static schedule, the compiler places instruction 655*r* well in advance of when the data is required, but this may be because that is when the data transfer path is available or perhaps the data was transferred out of the sourcing PE in order to make room in that PE.

Execution of the instructions according to the static schedule at run-time may be implemented in different ways. In one approach, the computer program includes an express schedule for the execution of the instructions. Continuing the example of FIG. 6C, the computer program may specify that instruction 655*a* executes at cycle c0, instruction 655*b* at cycle c1, instruction 655*c* at cycle c2, etc. Alternatively, the compiler may fill each instruction stream with NO-OPs to achieve the correct timing. A NO-OP (no operation) is an instruction that occupies a certain number of cycles without other activity. For example, the compiler knows that instruction 655*a* will end at cycle c1 and instruction 655*b* is supposed to begin at cycle c1. It may fill the space between cycles c0 and c1 with NO-OPs for the PE1 C pipeline. The PE1 C pipeline then just continuously executes instructions from its queue, and the NO-OPs ensure that instruction 655*b* is executed according to the compiler's static schedule. In yet another approach, the static schedule may be implemented by hardware. The PE1 C pipeline may just stall on the execution of instruction 655*b* until the data from instruction 655*a* is ready. The compiler knows that data will be ready at cycle c1 and, therefore, instruction 655*b* will execute starting at cycle c1 even though the PEs are unaware of the static schedule. Regardless of the implementation, for convenience, all of these situations will be described using the phrase "static schedule." Thus, a statement that the compiler statically schedules the instructions is intended to include all of the above implementations and is not meant to imply that the computer program expressly includes a scheduled time for each instruction.

In order to statically schedule the instructions, the compiler typically will know the duration of each instruction (i.e., how long each instruction takes to execute), the capabilities of each PE (which PEs can execute which instructions), the topology of data transfer paths to and from PEs (including between PEs, and between PEs and on-chip memory), and the computations required and their dependencies (i.e., the MLN description). With this information, the compiler can schedule unconditional start times for the PE instructions. Here, unconditional refers to run-time conditions. The execution order of statically scheduled instructions will not change as a result of run-time conditions, branching or dependence on input values. As a result, compute instructions may be scheduled for start times when all of the required data for the computation is known to be available and the compute pipeline is also known to be available. The need for run-time determination of whether data has arrived and whether the compute pipeline is available may be avoided. Analogously, data transfer instructions may be scheduled for start times when the data transfer path is known to be available. The need for circuitry to handle arbitrations, or to check for or resolve contentions and collisions on shared data transfer paths at run-time may be avoided. The need for routing tables and other circuitry to determine routing at run-time may also be avoided.

The static schedule of FIG. 6C occurs within the computing mesh 699. The compiler assumes that instructions executed according to the static schedule have been fetched from the off-chip memory 660 in time for their execution, for example, that compute instruction 655*b* has been fetched from off-chip memory by cycle c1, and compute instruction 655*d* has been fetched by cycle c3. Similarly, the compiler also assumes that data used by instructions of the static schedule have also been retrieved from the off-chip memory 660 in time for their consumption. For example, if the data for data transfer instruction 655*a* is coming from off-chip memory, then it has been transferred to the relevant SE or PE by cycle c0, so it can then be transferred by instruction 655*a* to PE1. Similarly, the data for data transfer instruction 655*c* has been transferred to the relevant SE or PE by cycle c2.

Figure 7:
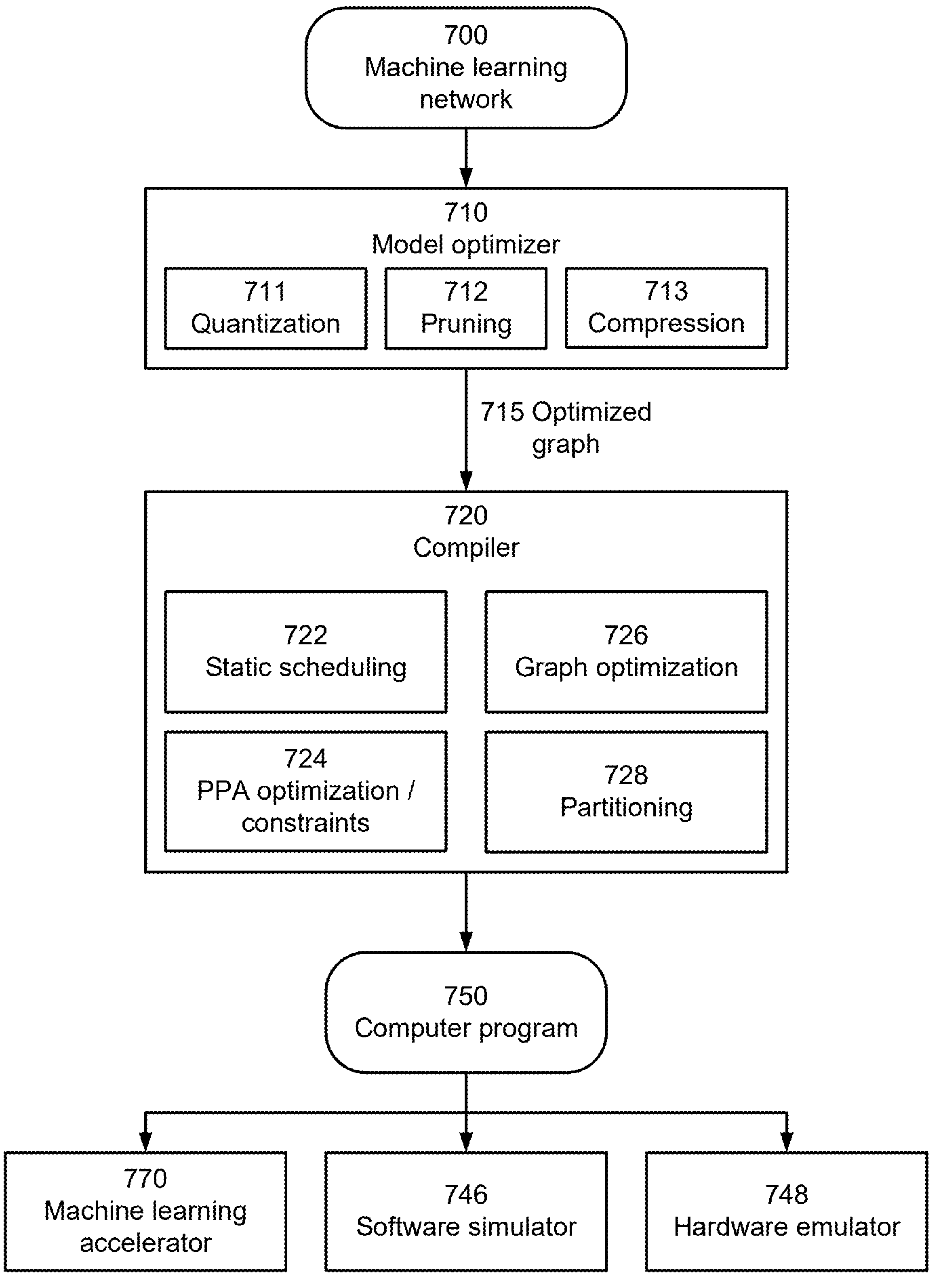
FIG. 7 is a block diagram of a software development environment including a machine learning (ML) compiler.

FIG. 7 is a block diagram of a software development environment including a machine learning (ML) compiler 720. In this example, the software development environment also includes a model optimizer 710. The model optimizer 710 receives a description of the MLN 700 and produces an optimized graph 715 of the MLN. It may apply optimizations such as quantization 711, pruning 712 and/or compression 713. Quantization 711 reduces the resolution of calculated values. For example, floating point values may be quantized to a certain number of bits and then integer math used instead of floating point math. This reduces the complexity and power consumed by the PEs. Pruning 712 removes parts of the MLN that do not contribute significantly to the overall results. For example, if certain weights are zero or close to zero, those weighted interconnects may be pruned. Finally, because MLNs contain a large amount of data, compression may be used successfully to reduce data transfer bandwidths.

The resulting optimized description 715 of the MLN may be expressed as a graph, in which the nodes of the graph represent nodes in the MLN and the edges of the graph represent the weighted interconnects. The compiler 720 receives the optimized graph 715 and produces the resulting computer program 750. The compiler 720 may perform operations including static scheduling 722, PPA (power performance area) optimizations 724, graph optimizations 726 and/or partitioning 728.

In order to statically schedule 722 the deterministic instructions, the compiler typically will know the duration of each instruction (i.e., how long each instruction takes to execute), the capabilities of each element (which processing elements and storage elements can execute which instructions), the topology of data transfer paths to and from PEs (including between PEs, and between PEs and on-chip memory), and the computations required and their dependencies (i.e., the MLN description). With this information, the compiler can schedule unconditional start times for the deterministic instructions. Here, unconditional refers to run-time conditions. The execution order of statically scheduled instructions will not change as a result of run-time conditions, branching or dependence on input values. As a result, compute instructions may be scheduled for start times when all of the required data for the computation is known to be available and the compute pipeline is also known to be available. The need for run-time determination of whether data has arrived and whether the compute pipeline is available may be avoided. Analogously, data transfer instructions may be scheduled for start times when the data transfer path is known to be available. The need for circuitry to handle arbitrations, or to check for or resolve contentions and collisions on shared data transfer paths at run-time may be avoided. The need for routing tables and other circuitry to determine routing at run-time may also be avoided.

PPA optimization 724 includes different optimizations of the computer program 750. For example, the allocation of MLN computations to PEs may be optimized to reduce power consumption, to increase performance (such as reducing latency or increasing throughput) and/or to reduce area (e.g., number of PEs used). The compiler 720 may also optimize 724 the computer program 750, subject to constraints on power, performance, area and/or any of the quantities described above. Graph optimization 726 includes analysis of the graph representing the MLN to prune, merge or quantize links, parameters, values, and layers to achieve better performance. Partitioning 728 concerns mapping the computations in the MLN to an implementation on the MLA. This includes determining which computations are allocated to which PEs and how data flows through the mesh of PEs during computation. If there are multiple mosaics, it also includes determining which computations are allocated to which mosaics.

The resulting computer program 750 may be loaded into memory for execution on a machine learning accelerator 770. For example, one possible application is object detection. In this case, the inputs are images captured by a video camera. The MLN 700 has been trained to identify certain objects in the video images. The computer program 750 implementing the MLN is loaded onto memory that is accessible by the MLA 770, which is implemented as a chip inside the camera. This way, images captured by the video camera may be immediately analyzed by the computer program 750 running on the MLA 770.

In addition to the MLA 770, the computer program 750 or parts of it may be run on a software simulator 746 and/or hardware emulator 748 (including FPGAs configured as MLAs). These may be used for product development, debugging and/or prototyping. For some purposes, a full simulation or emulation is not necessary. For example, to check that there are no collisions or conflicts between statically scheduled instructions, only the flow of data may be simulated or emulated. It is not necessary to compute actual values.

Figure 8:
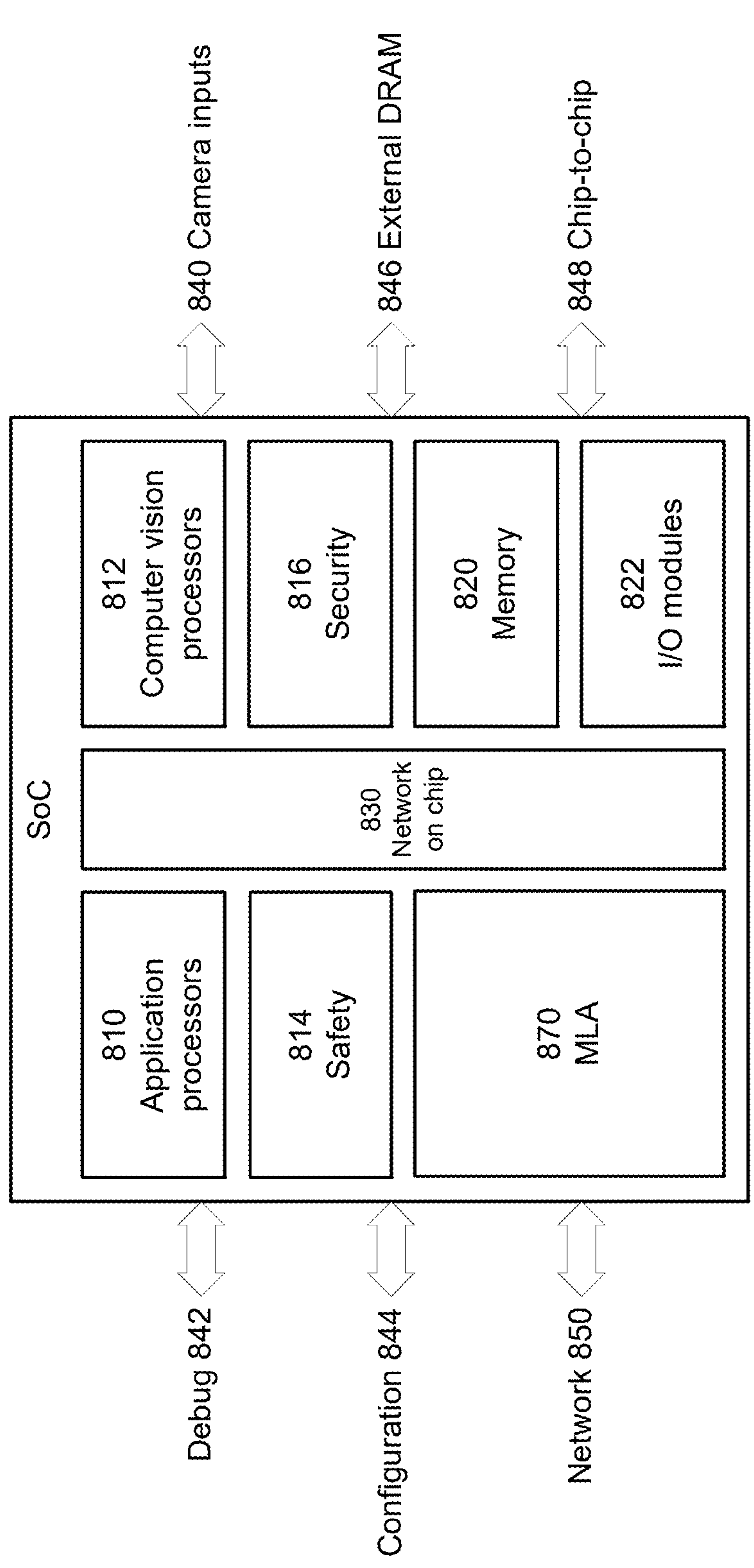
FIG. 8 is a block diagram of an integrated circuit that includes an MLA.

As discussed above, the MLA includes various components that are on the same die. The MLA may be integrated into a larger integrated circuit product (e.g., as part of an edge device). FIG. 8 is a block diagram of an integrated circuit that includes an MLA 870. Other components may be included on the same die as the MLA. This example includes the following additional blocks: application processor 810 (e.g., general purpose CPU running applications), computer vision processor 812 (or other types of application-specific processors), safety 814, security 816, additional SRAM (memory) 820 and input/output circuitry 822. It also includes a network 830 for communication between the different components. This type of semiconductor chip may be referred to as a system-on-chip (SoC).

The connections to the external world include camera inputs 840 for the computer vision processors, ports for debug 842 and configuration 844, a connection 846 to external memory (e.g., DRAM), chip-to-chip connections 848, and network connections 850 (e.g., Ethernet and PCIe).

The SoC of FIG. 8 may be combined with other components to perform various tasks in edge devices. Example applications for edge devices include automotive and other forms of transportation including autonomous transportation, agricultural, industrial, robotics, drones, surveillance and security, smart environments including smart cities, medical and personalized health. Example tasks include computer vision, image analysis, image understanding, speech recognition, audio analysis, audio understanding, natural language processing, classification and pattern recognition tasks. For edge devices, it may be desirable to perform certain tasks in real-time.

In addition to memory and other programmable processors, an edge device may also include sensors, such as cameras (both still image and video cameras), microphones, temperature sensors, pressure sensors and other types of sensors. The sensors may capture samples that are used as inputs to a computing pipeline within the edge device. For example, image samples may be input to the computer vision processors 812, which perform initial operations such as edge detection and enhancement, contrast enhancement, motion detection, and optical flow. Raw and/or processed images may be then input to the MLA 870 for analysis by the machine learning network. The MLA may also receive other inputs, such as metadata from other sources and data from other sensors. The application processors 810 may also perform various functions in the overall pipeline and may also serve as a master controller that coordinates operation of the MLA and the other programmable processors in the pipeline.

Edge devices may be portable with less power available for computations compared to, for example, cloud-based server farms. It may also be desirable for the computing pipeline within the edge device to perform tasks without utilizing cloud-based or other remote compute resources. In some implementations, the MLA implements computations in the machine learning network at a speed of at least 50 TOPs (50 trillion operations per second) at a power consumption of not more than 5 watts. The speed may be increased by increasing the number of PEs in the mesh or the number of compute meshes on the die.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A compute cluster implemented as a semiconductor integrated circuit, the compute cluster comprising:
- a compute mesh of interconnected compute elements; and
- a forwarded reconvergent clock mesh that distributes a clock signal to the compute elements; the clock mesh comprising nodes connected by branches, and repeaters on the branches between nodes; wherein the repeaters limit the clock signal to forward propagation along each branch of the clock mesh and prevent backward propagation along each branch of the clock mesh, and for at least some pairs of first and second nodes of the clock mesh, at least two different forward propagation paths connect the first node to the second node and all forward propagation paths from the first node to the second node contain a same number of repeaters.

2. The compute cluster of claim 1, wherein for any pair of first and second nodes of the clock mesh, all forward propagation paths from the first node to the second node contain a same number of repeaters.

3. The compute cluster of claim 1, wherein each branch contains a same number of repeaters.

4. The compute cluster of claim 1, wherein at least one of the repeaters comprises two or more standard cell repeaters connected in parallel.

5. The compute cluster of claim 1, further comprising:
- tap repeaters corresponding to the compute elements, wherein each tap repeater distributes the clock signal from a different one of the branches to the corresponding compute element.

6. The compute cluster of claim 1, wherein a local clock skew between adjacent compute elements is less than a specification for clock skew, but a maximum global clock skew across the compute mesh is more than the specification for clock skew.

7. The compute cluster of claim 6, wherein the maximum global clock skew is less than one period of the clock signal.

8. The compute cluster of claim 6, wherein the local clock skew is less than 50 ps.

9. The compute cluster of claim 6, wherein the local clock skew is less than 5% of one period of the clock signal.

10. The compute cluster of claim 1, wherein the compute mesh is a rectangular array of interconnected compute elements with each compute element connected to its nearest neighbors, and the clock mesh is a rectangular array of nodes connected by branches and the clock signal propagates diagonally across the rectangular array of nodes.

11. The compute cluster of claim 10, wherein each branch contains a same number of repeaters.

12. The compute cluster of claim 1, further comprising:
- local memory accessed by the compute elements of the compute mesh; and
- tap repeaters that distribute the clock signal from the clock mesh to the local memory.

13. The compute cluster of claim 1, further comprising:
- channel logic and/or peripheral logic that operates in conjunction with the compute elements of the compute mesh; and
- tap repeaters that distribute the clock signal from the clock mesh to the channel logic and/or peripheral logic.

14. A machine learning accelerator (MLA) implemented as a semiconductor integrated circuit, the MLA comprising:
- an on-chip memory system configured to store data used in computations for implementing a machine learning network;
- a compute mesh of interconnected processing elements (PEs) coupled to the on-chip memory system, the PEs configured to execute instructions that implement computations in the machine learning network using the data stored in the on-chip memory system, wherein the instructions are statically scheduled relative to each other and the static schedule is timed by a common clock signal; and
- a forwarded reconvergent clock mesh that distributes the common clock signal to the PEs, the clock mesh comprising nodes connected by branches, and repeaters on the branches between nodes; wherein the repeaters limit the clock signal to forward propagation along each branch of the clock mesh and prevent backward propagation along each branch of the clock mesh, and for at least some pairs of first and second nodes of the clock mesh, at least two different forward propagation paths connect the first node to the second node and all forward propagation paths from the first node to the second node contain a same number of repeaters.

15. The MLA of claim 14, wherein the statically scheduled instructions have unconditional start times so that the PEs execute the instructions without any run-time determination of whether the data, PEs or data transfer paths required for the instructions are available.

16. The MLA of claim 14, wherein the compute mesh is a rectangular array of interconnected PEs with each PE connected to its nearest neighbors; the clock mesh is a rectangular array of nodes connected by branches and each branch contains a same number of repeaters; and for any pair of first and second nodes of the clock mesh, all forward propagation paths from the first node to the second node contain a same number of repeaters.

17. The MLA of claim 16, wherein a local clock skew between nearest neighbor PEs is less than a specification for clock skew, but a maximum global clock skew between PEs on diagonally opposite corners of the compute mesh is more than the specification for clock skew.

18. The MLA of claim 14, further comprising:

channel logic that operates in conjunction with the PEs and the on-chip memory system; and tap repeaters that distribute the clock signal from the clock mesh to the on-chip memory system and to the channel logic.

19. The MLA of claim 14, wherein the clock signal has a frequency of at least 1 GHz, a supply voltage for the PEs is not more than 750 mV, and a clock skew between adjacent PEs is not more than 50 ps.

* * * * *